(12) United States Patent
Krishnamoorthy et al.

(10) Patent No.: US 8,711,013 B2
(45) Date of Patent: Apr. 29, 2014

(54) CODING CIRCUITRY FOR DIFFERENCE-BASED DATA TRANSFORMATION

(75) Inventors: Prakash Krishnamoorthy, Bethlehem, PA (US); Ramesh C. Tekumalla, Breinigsville, PA (US); Parag Madhani, Allentown, PA (US)

(73) Assignee: LSI Corporation, San Jose, CA (US)

( * ) Notice: Subject to any disclaimer, the term of this patent is extended or adjusted under 35 U.S.C. 154(b) by 43 days.

(21) Appl. No.: 13/351,798

(22) Filed: Jan. 17, 2012

(65) Prior Publication Data

US 2013/0181852 A1  Jul. 18, 2013

(51) Int. Cl.
*H03M 7/30* (2006.01)

(52) U.S. Cl.
USPC ... 341/76; 341/143; 375/240.12; 375/240.16; 375/240.27; 714/784; 714/785; 714/792

(58) Field of Classification Search
USPC ............ 341/76, 143; 375/240.16, 240.12, 375/240.27; 714/784, 785, 792
See application file for complete search history.

(56) References Cited

U.S. PATENT DOCUMENTS

| | | | |
|---|---|---|---|
| 5,384,598 A | 1/1995 | Rodriguez et al. | |
| 6,718,502 B1 * | 4/2004 | Kuznetsov et al. | 714/755 |
| 6,980,143 B2 * | 12/2005 | Linzmeier et al. | 341/143 |
| 7,398,450 B2 * | 7/2008 | Konishi et al. | 714/772 |
| 7,428,692 B2 * | 9/2008 | Konishi et al. | 714/772 |
| 8,060,551 B2 | 11/2011 | Avss et al. | |
| 8,160,153 B2 * | 4/2012 | Viscito et al. | 375/240.25 |
| 8,364,495 B2 * | 1/2013 | Morii | 704/500 |
| 2001/0033621 A1 * | 10/2001 | Khayrallah | 375/244 |
| 2002/0010702 A1 | 1/2002 | Ajtai et al. | |
| 2002/0062327 A1 * | 5/2002 | Takano et al. | 708/300 |
| 2003/0169928 A1 * | 9/2003 | Stanek | 382/232 |
| 2005/0157883 A1 * | 7/2005 | Herre et al. | 381/17 |
| 2009/0092326 A1 * | 4/2009 | Fukuhara et al. | 382/233 |
| 2009/0217124 A1 * | 8/2009 | Litsyn et al. | 714/752 |
| 2010/0104221 A1 * | 4/2010 | Yeung et al. | 382/297 |

(Continued)

FOREIGN PATENT DOCUMENTS

WO  2010017322 A1  2/2010

OTHER PUBLICATIONS

M. Burrows et al., "A Block-Sorting Lossless Data Compression Algorithm," Systems Research Center, SRC Research Report 124, May 1994, 24 pages.

(Continued)

*Primary Examiner* — Linh Nguyen
(74) *Attorney, Agent, or Firm* — Ryan, Mason & Lewis, LLP

(57) ABSTRACT

Coding circuitry for difference-based data transformation in an illustrative embodiment comprises a difference-based encoder having a plurality of processing stages, with the difference-based encoder being configured to generate respective orders of difference from a sequence of data samples and to output encoded data determined based on at least a selected one of the orders of difference. The coding circuitry may be configured to implement lossless, linear compression of the sequence of data samples. The coding circuitry may additionally or alternatively comprise a difference-based decoder having a plurality of processing stages, with the difference-based decoder being configured to process encoded data comprising selected ones of a plurality of orders of difference and to reconstruct a sequence of data samples based on the selected orders of difference.

26 Claims, 9 Drawing Sheets

(56) References Cited

U.S. PATENT DOCUMENTS

2010/0161568 A1* 6/2010 Xiao .......................... 707/693
2010/0202508 A1* 8/2010 Karaoguz et al. ........ 375/240.01
2012/0269268 A1* 10/2012 Kim et al. ................ 375/240.16

OTHER PUBLICATIONS

Didier Le Gall, "MPEG: A Video Compression Standard for Multimedia Applications," Communications of the ACM, Apr. 1991, pp. 46-58, vol. 34, No. 4.

T. Liebchen et al., "MPEG-4 ALS: an Emerging Standard for Lossless Audio Coding," Data Compression Conference (DCC), Mar. 2004, pp. 439-448.

H. Nyquist, "Certain Topics in Telegraph Transmission Theory," Transactions of the A.I.E.E., Feb. 1928, pp. 617-644, Reprinted in IEEE, Classic Paper, Feb. 2002, pp. 280-305, vol. 90, No. 2.

C.E. Shannon, "A Mathematical Theory of Communication," The Bell System Technical Journal, July, Oct. 1948, pp. 379-423, 623-656, vol. 27.

Claude E. Shannon, "Communication in the Presence of Noise," Proceedings of the IRE, Jan. 1949, pp. 10-21, vol. 37, No. 1, Reprinted in IEEE, Classic Paper, Feb. 1998, pp. 447-457, vol. 86, No. 2.

M.R. Stan et al., "Bus-Invert Coding for Low-Power I/O," IEEE Transactions on Very Large Scale Integration (VLSI) Systems, Mar. 1995, pp. 49-58, vol. 3, No. 1.

J. Ziv et al., "Compression of Individual Sequences via Variable-Rate Coding," IEEE Transactions on Information Theory, Sep. 1978, pp. 530-536, vol. 24, No. 5.

Electronic Industries Alliance, "DDR2 SDRAM Specification," JEDEC Standard, JESD79-2E, Apr. 2008, 128 pages.

Y. Aghaghiri et al., "Reducing Transitions on Memory Buses Using Sector-Based Encoding Technique," ACM International Symposium on Low Power Electronics and Design (ISLPED), Aug. 2002, pp. 190-195, Monterey, California.

S. Komatsu et al., "Low Power Chip Interface Based on Bus Data Encoding with Adaptive Code-Book Method," IEEE, 9th Great Lakes Symposium on VLSI, Mar. 1999, pp. 368-371, Ypsilanti, Michigan.

E. Mussoll et al., "Reducing the Energy of Address and Data Buses with the Working-Zone Encoding Technique and its Effect on Multimedia Applications," Workshop on Power Driven Microarchitecture in Conjunction with the 25th International Symposium of Computer Architecture (ISCA), 1998, pp. 3-8, Barcelona, Spain.

N. Xie et al., "Using Lossless Data Compression in Data Storage Systems: Not for Saving Space," IEEE Transactions on Computers, Mar. 2011, pp. 335-345, vol. 60, No. 3.

J. Ziv et al., "A Universal Algorithm for Sequential Data Compression," IEEE Transactions on Information Theory, May 1977, pp. 337-343, vol. IT-23, No. 3.

* cited by examiner

CODING CIRCUITRY FOR DIFFERENCE-BASED DATA TRANSFORMATION

BACKGROUND

Modern processing devices such as computers, servers, mobile telephones, and storage devices are often required to perform various types of data transformation. For example, data compression is a fundamental operation in a wide variety of communication and storage systems. As is well known, data compression techniques may be lossless or lossy, and may be linear or non-linear.

Examples of lossless data compression techniques include Lempel-Ziv (LZ) compression algorithms such as LZ77 and LZ78, described in J. Ziv and A. Lempel, "A Universal Algorithm for Sequential Data Compression," IEEE Transactions on Information Theory, 23(3), pp. 337-343, May 1977, and J. Ziv and A. Lempel, "Compression of Individual Sequences via Variable-Rate Coding," IEEE Transactions on Information Theory, 24(5), pp. 530-536, September 1978, respectively. Another example is the Burrows-Wheeler transform, described in M. Burrows and D. Wheeler, "A block sorting lossless data compression algorithm," Technical Report 124, Digital Equipment Corporation, 1994.

Lossy data compression techniques are generally data specific, and include, for example, perceptual audio coding (PAC) or MP3 algorithms for audio data, JPEG algorithms for image data, and MPEG algorithms for video data.

These and many other commonly-used data compression techniques are non-linear, which can create a problem in that subsequent signal processing operations performed on decompressed data are very often linear operations. As a result, data compressed using non-linear compression usually must be decompressed to recover the original data before being subject to linear signal processing operations. Typically, most signal processing operations are computation and power intensive, and therefore any reduction in the amount of data subject to signal processing will help reduce both signal processing complexity and the associated power dissipation.

Accordingly, a need exists for an improved lossless, linear data compression technique that can allow compressed data to be subject to linear signal processing operations. Such an arrangement could significantly reduce the complexity of signal processing operations while providing additional benefits in the form of reduced power dissipation, improved signal integrity and better bandwidth utilization.

SUMMARY

One or more illustrative embodiments of the present invention meet the above-identified need by providing improved lossless, linear data compression techniques utilizing difference-based data transformation.

In one embodiment, coding circuitry comprises a difference-based encoder having a plurality of processing stages, with the difference-based encoder being configured to generate respective orders of difference from a sequence of data samples, and to output encoded data determined based on at least a selected one of the orders of difference.

By way of example, the difference-based encoder may be configured to process a set of data samples in order to compute a set of orders of difference, to determine for each of the data samples in the set of data samples a least number of bits needed to represent that data sample, to determine for each of the orders of difference in the set of orders of difference a number of bits needed to represent that order of difference, based on the least numbers of bits needed to represent the respective data samples, and to output encoded data identifying a particular one of the orders of difference selected based on the numbers of bits needed to represent the orders of difference.

Coding circuitry in one or more embodiments may additionally or alternatively comprise a difference-based decoder having a plurality of processing stages, with the difference-based decoder being configured to process encoded data comprising selected ones of a plurality of orders of difference and to reconstruct a sequence of data samples based on the selected orders of difference.

By way of example, coding circuitry in a given embodiment may comprise an encoder-decoder ("codec") that incorporates both a difference-based encoder and a difference-based decoder, so as to allow a corresponding processing device to support bidirectional coded communication with one or more other devices.

Coding circuitry in a given embodiment can be implemented in the form of one or more integrated circuits. For example, such coding circuitry comprising one or both of a difference-based encoder and a difference-based decoder may be implemented in a processor integrated circuit of a communication device, or in a system-on-chip (SOC) integrated circuit comprising read channel circuitry of a storage device.

DETAILED DESCRIPTION

Illustrative embodiments of the invention will be described herein with reference to exemplary communication systems, storage systems and associated coding circuitry and difference-based transformation algorithms. It should be understood, however, that other embodiments can be implemented using a wide variety of other types and arrangements of systems, circuitry and algorithms.

Figure 1:
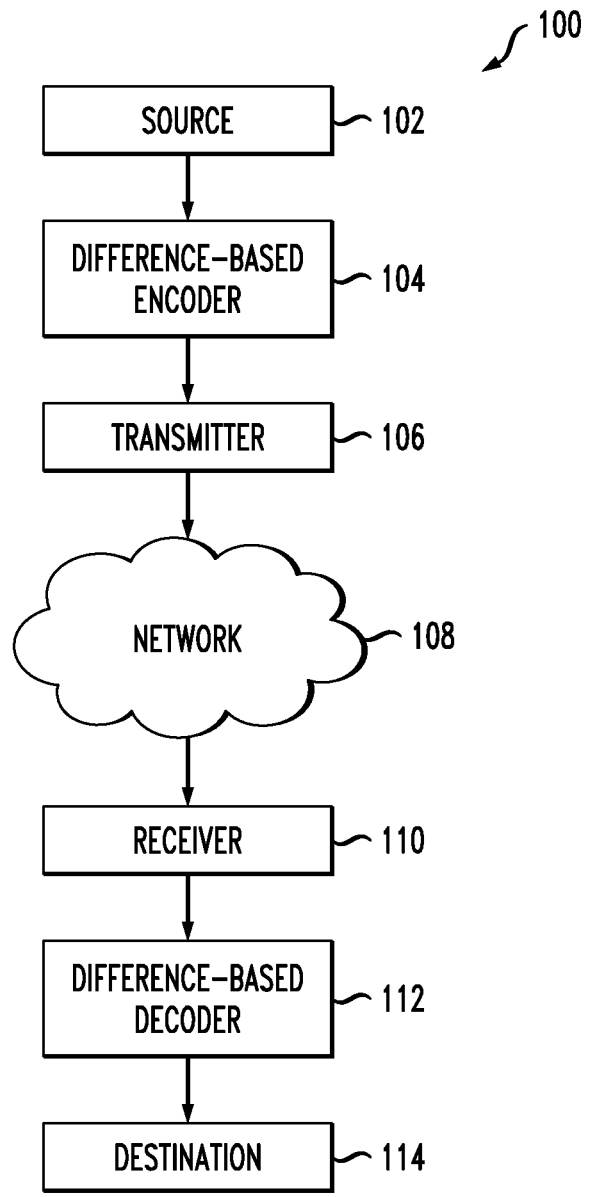
FIG. 1 is a block diagram of a communication system comprising coding circuitry that utilizes difference-based data transformation in an illustrative embodiment.

FIG. 1 shows a network-based communication system 100 comprising difference-based coding circuitry in an illustrative embodiment. In this embodiment, data from a source device 102 is applied to a difference-based encoder 104. The source data may comprise text, audio, images, video or other types of information, in any combination. The encoder 104 uses difference-based data transformation to process the source data into compressed data that is provided to a transmitter 106 for delivery over a network 108 to a receiver 110. The receiver 110 provides the compressed data to a difference-based decoder 112 which recovers the original source data for delivery to a destination device 114.

The difference-based encoding implemented using encoder 104 in the present embodiment may be configured to provide, for example, lossless, linear data compression in a manner to be described in greater detail below. Such an arrangement allows linear signal processing operations to be applied to the compressed data in transmitter 106 and receiver 110, thereby reducing signal processing complexity and power consumption in the system 100, while also providing additional benefits such as improved signal integrity and better bandwidth utilization.

Figure 2:
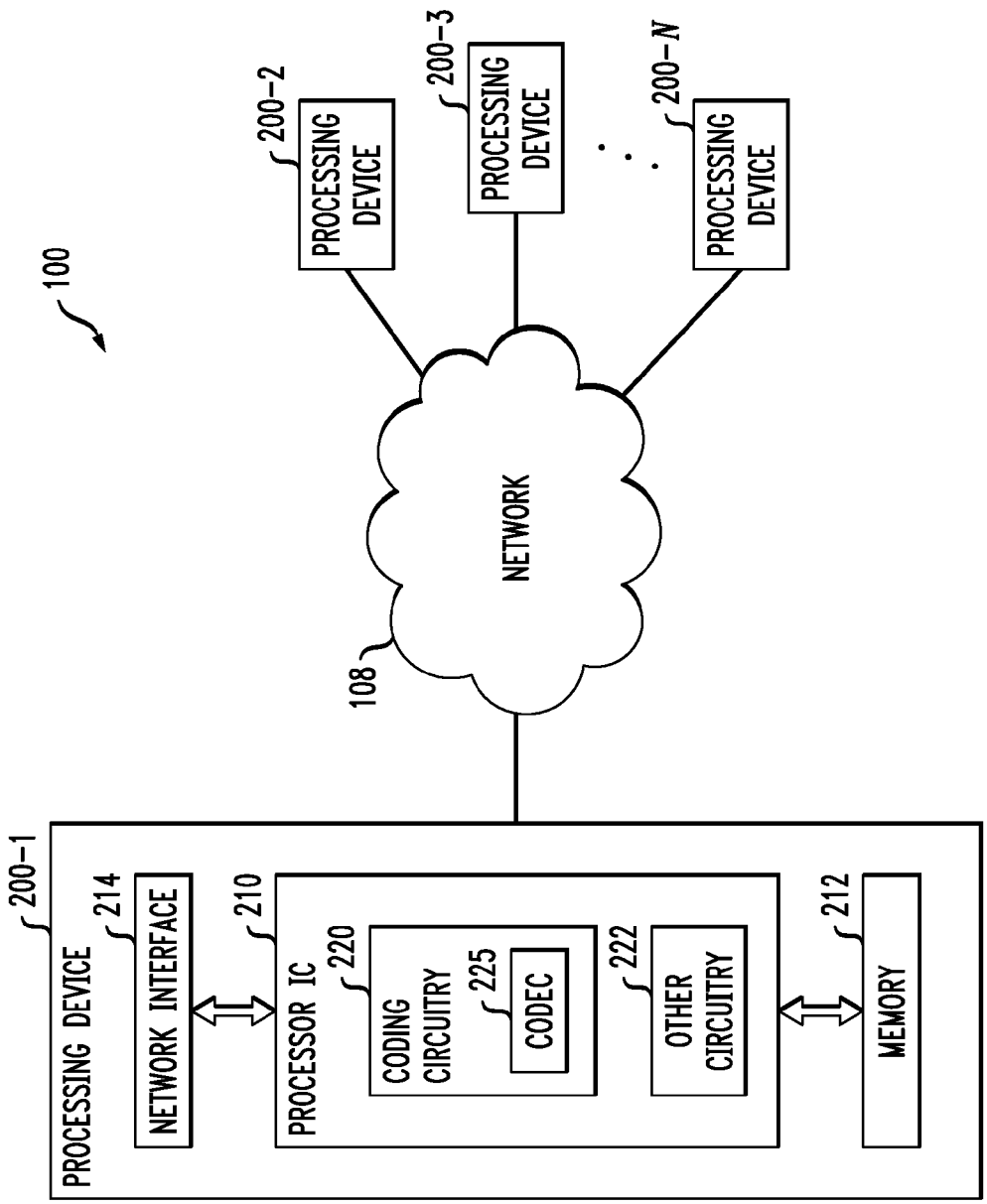
FIG. 2 shows another view of the communication system of FIG. 1.

The communication system 100 may be implemented using multiple computers, servers, mobile telephones, storage devices or other processing devices as illustrated in FIG. 2. In this embodiment, system 100 is illustrated as comprising a plurality of processing devices 200-1, 200-2, ... 200-N that communicate over network 108. Processing device 200-1 is shown in greater detail as comprising a processor integrated circuit 210, a memory 212 and a network interface 214, and one or more of the remaining processing devices 200-2 through 200-N may each be configured in a similar manner.

The processor integrated circuit 210 is coupled to the memory 212 and the network interface 214, and further comprises coding circuitry 220 and other circuitry 222. The other circuitry 222 may comprise, for example, a central processing unit (CPU), an arithmetic logic unit (ALU), a digital signal processor (DSP), internal processor memory, as well as other types of internal processor circuitry, in any combination.

The coding circuitry 220 further comprises a codec 225 configured to perform both difference-based encoding and decoding operations. Thus, codec 225 may be viewed as comprising both the difference-based encoder 104 and the difference-based decoder 112, such that the processing device 200-1 can perform encoding operations to generate compressed data for delivery to other processing devices over the network 108, and can also perform decoding operations on compressed data delivered to it from other processing devices over the network 108. As will be described in greater detail below, such encoding and decoding operations associated with bidirectional communication between the devices 200 may be performed in the present embodiment using a lossless, linear difference-based coding algorithm, but other algorithms can be used in other embodiments.

It should be appreciated that a given one of the processing devices 200 can therefore be both a source of data for encoding and a destination for decoded data. Thus, a given processing device 200 may incorporate elements 102, 104, 106, 110, 112 and 114 of FIG. 1, or only a subset of these elements. For example, one or more of the processing devices 200 may be configured to perform encoding only or decoding only, as appropriate for a given device type.

Figure 3:
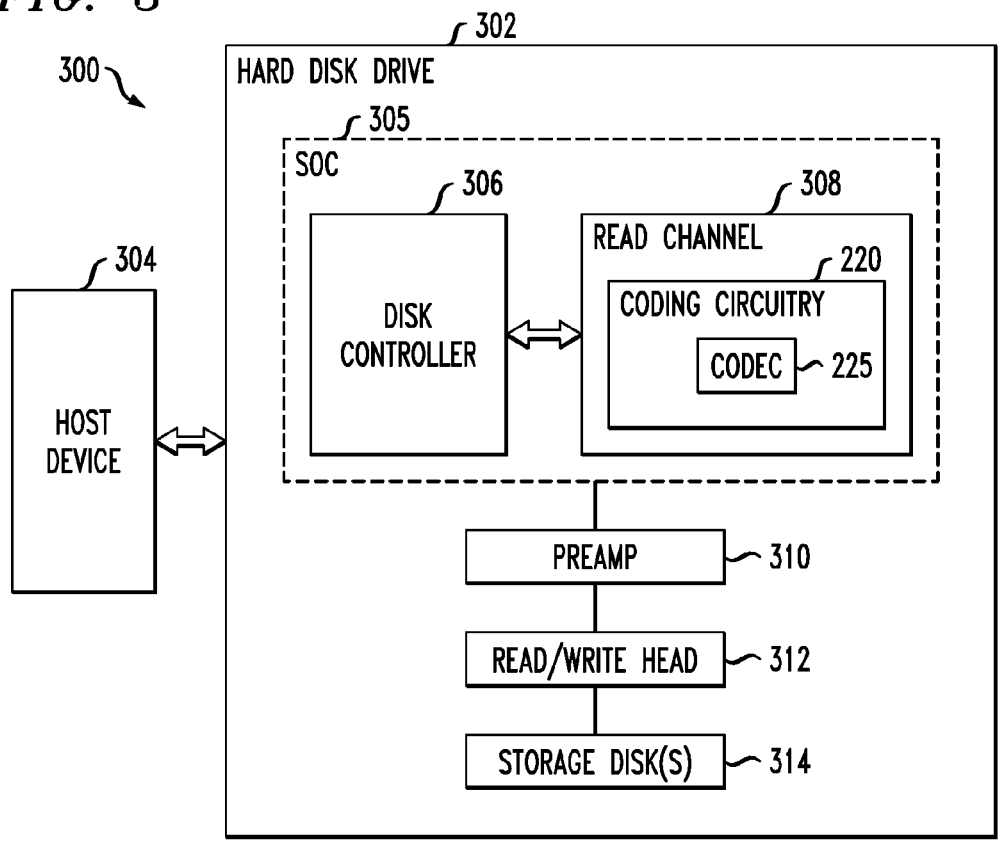
FIG. 3 is a block diagram of a storage system comprising coding circuitry that utilizes difference-based data transformation in an illustrative embodiment.

The term "coding circuitry" as used herein is intended to be broadly construed, so as to encompass at least one of a difference-based encoder and a difference-based decoder, and may also encompass related portions of a transmitter and a receiver. For example, portions of the transmitter 106 and receiver 110 that are utilized in performing operations relating to data compression or data decompression as described herein may be considered part of the coding circuitry of a given processing device of system 100. Such coding circuitry need not comprise a codec 225 as illustrated in FIGS. 2 and 3, and may instead comprise other types of hardware, software or firmware, in any combination. A given instance of "coding circuitry" as the term is broadly used herein may therefore encompass an encoder, a decoder or both, as in a codec configuration, or other similar coding devices, and possibly additional related signal processing circuitry, control circuitry or other circuitry.

The particular configuration of network-based communication system 100 as shown in FIGS. 1 and 2 is exemplary only, and the system 100 in other embodiments may include other elements in addition to or in place of those specifically shown, including one or more elements of a type commonly found in a conventional implementation of such a system. For example, the processor integrated circuit 210 may comprise, by way of illustration only and without limitation, a microprocessor, an application-specific integrated circuit (ASIC), a field-programmable gate array (FPGA), or other type of data processing device, as well as portions or combinations of these and other devices.

Also, the coding circuitry 220 comprising codec 225 can be implemented in numerous other types of systems. Another embodiment of such a system, in the form of a storage system 300 comprising a data storage device that incorporates coding circuitry 220 comprising codec 225, is illustrated in FIG. 3. In this embodiment, the coding circuitry 220 comprising codec 225 is provided as part of a system-on-chip (SOC) integrated circuit in a hard disk drive (HDD) controller application, designed for reading and writing data from one or more magnetic storage disks of an HDD. Other examples of systems that may incorporate coding circuitry as disclosed herein include flash memory controllers and other types of memory interfaces.

The storage system 300 as shown in FIG. 3 comprises an HDD 302 coupled to a host device 304. The HDD 302 comprises an SOC integrated circuit 305 comprising a disk controller 306 coupled to read channel circuitry 308. The SOC 305 communicates via a preamplifier 310 with a read/write head 312 in order to write data to and read data from one or more storage disks 314. The read channel circuitry 308 includes coding circuitry 220 comprising codec 225 and may also comprise other elements not explicitly shown, such as one or more DSPs. The host device 304 may comprise, for example, a computer or other processing device that is coupled to or incorporates the HDD 302. Such a processing device may comprise processor and memory elements used to execute software code.

It should also be noted that the broad term "coding circuitry" as used herein is intended to be construed so as to encompass processor circuitry that implements encoding or decoding operations at least in part in the form of software that is executed in a processor. For example, at least a portion of a difference-based transformation algorithm for data compression or decompression as disclosed herein may be implemented in the form of software that is stored in a memory such as memory 212 or an internal memory of processor 210 in the FIG. 2 embodiment, or in an internal memory or external memory of the SOC 305 in the FIG. 3 embodiment.

A given such memory that stores software code for execution by a corresponding processor is an example of what is more generally referred to herein as a computer-readable medium or other type of computer program product having computer program code embodied therein, and may comprise, for example, electronic memory such as random access memory (RAM) or read-only memory (ROM), magnetic memory, optical memory, or other types of storage devices in any combination. The processor may comprise a microprocessor, CPU, ASIC, FPGA or other type of processing device, as well as portions or combinations of such devices. Although not expressly shown in FIG. 3, such a processor may be implemented in the SOC 305, or in another part of the HDD 302.

As indicated above, embodiments of the invention may be implemented in the form of integrated circuits. In a given such integrated circuit implementation, identical die are typically formed in a repeated pattern on a surface of a semiconductor wafer. Each die includes coding circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of the invention.

Difference-based encoding and decoding operations performed in illustrative embodiments by encoder 104 and decoder 112, respectively, will now be described in greater detail with reference to FIGS. 4, 5 and 6.

Assume initially that the data to be encoded comprises a data sequence obtained by sampling a pure sinusoid $A \sin(2\pi ft+\phi)$ at a rate $f_s$. The sampled sequence takes the form $$A \sin(2\pi fk\delta+\phi), k \geq 0$$

where $$\delta = \frac{1}{f_s}$$

is the sampling interval, $\phi$ is the phase shift in radians and k is the index of the sample in the sequence. We now define $\Delta^1(k)$ as the first order of difference between the (k+1)-th and k-th samples of this sequence as $$\Delta^1(k) = A \sin(2\pi f(k+1)\delta+\phi) - A \sin(2\pi fk\delta+\phi)$$

The first order of difference is also referred to herein as first order differenced data. Substituting $$\delta = \frac{1}{f_s}$$

and performing further simplification yields $$\Delta^1(k) = A\left(2\sin\left(\frac{\pi f}{f_s}\right)\right)\sin\left(\frac{2\pi fk}{f_s} + \varphi + \frac{\pi f}{f_s} + \frac{\pi}{2}\right) \quad (1)$$

More generally, an n-th order of difference between successive samples of this sequence, also referred to herein as an n-th order of difference, can be written as $$\Delta^n(k) = A\left(2\sin\left(\frac{\pi f}{f_s}\right)\right)^n \sin\left(\frac{2\pi fk}{f_s} + \varphi + \frac{n\pi f}{f_s} + \frac{n\pi}{2}\right) \quad (2)$$

The magnitude of $\Delta^n(k)$ depends on the quantities $$\left(2\sin\left(\frac{\pi f}{f_s}\right)\right)^n \text{ and } \sin\left(\frac{2\pi fk}{f_s} + \varphi + \frac{n\pi f}{f_s} + \frac{n\pi}{2}\right).$$

We now examine the contribution of each term to the magnitude of the n-th order of difference $\Delta^n(k)$ as n increases.

The set of all possible values that the frequency f can assume falls into three intervals:

$$I_1 = \left\{\left(0, \frac{f_s}{6}\right) \cup \left(\frac{5f_s}{6}, f_s\right) \cup \left(f_s, \frac{7f_s}{6}\right) \cup \left(\frac{11f_s}{6}, 2f_s\right)\right\}$$

$$I_2 = \left\{0, \frac{f_s}{6}, \frac{5f_s}{6}, f_s, \frac{7f_s}{6}, \frac{11f_s}{6}, 2f_s\right\}$$

$$I_3 = \left\{\left(\frac{f_s}{6}, \frac{5f_s}{6}\right) \cup \left(\frac{7f_s}{6}, \frac{11f_s}{6}\right)\right\}$$

However, the range of values that contains information is confined to the interval $$\left[0, \frac{f_s}{2}\right)$$

when the signal is sampled at the Nyquist rate. The first term $$\left(2\sin\left(\frac{\pi f}{f_s}\right)\right)^n$$

decreases in magnitude as n increases when $f \in I_1$, remains a constant when $f \in I_2$ and increases in magnitude when $f \in I_3$.

The second term $$\sin\left(\frac{2\pi fk}{f_s} + \varphi + \frac{n\pi f}{f_s} + \frac{n\pi}{2}\right)$$

shifts the phase of the original signal by an amount $$\left(\frac{n\pi f}{f_s} + \frac{n\pi}{2}\right)$$

and in the process, allows the magnitude of this term to decrease or increase in comparison to the value prior to this phase shift. However, the range of values this term assumes is confined to the interval $[-1,1]$. Under conditions where $$\frac{f_s}{f} \simeq \alpha,$$

for some $\alpha \in \mathbb{Z}^+$, the phase of the original samples can be preserved by choosing $n=4\alpha$. Under these circumstances, Equation (2) can be rewritten as $$\Delta^n(k) = A\left(2\sin\left(\frac{\pi f}{f_s}\right)\right)^n \Delta^0(k) \quad (3)$$

where $\Delta^0(k)$ is the original sampled sequence, also referred to herein as zero order differenced data.

More generally, for any signal that can be expressed as a superposition of sinusoids of various frequencies given by $$\sum_{i=1}^{p}\sum_{j=1}^{q} A_{i,j} \sin\left(\frac{2\pi f_i k}{f_s} + \varphi_j\right) \quad (4)$$

and sampled at a rate $f_s > 2f_{max}$, the n-th order of difference $\Delta^n(k)$ can be written using Equation (2) as $$\sum_{i=1}^{p}\sum_{j=1}^{q} A_{i,j}\left(2\sin\left(\frac{\pi f_i}{f_s}\right)\right)^n \sin\left(\frac{2\pi f_i k}{f_s} + \varphi_j + \frac{n\pi f_i}{f_s} + \frac{n\pi}{2}\right) \quad (5)$$

In this case, the magnitude of the successive differences decreases for those terms that have $$f_i < \frac{f_s}{6},$$

remains the same for those that have $$f_i = \frac{f_s}{6}$$

and increases in magnitude for those that have $$f_i > \frac{f_s}{6}.$$

We will now describe an embodiment of a successive difference architecture for the encoder 104 and a technique for determining the number of bits needed to represent the differenced samples. This will be followed by description of an embodiment of the transmitter 106 which assembles and transmits the data in an optimal format. The functionality of the receiver 110 and decoder 112 will then be described.

Consider an implementation of data source 102 that generates a data sample $x_k$ at each of a plurality of discrete time steps k (k≥0). At any time step k, an encoder of order n (n≤k) examines a set of n+1 consecutive samples $\{x_{k-n}, x_{k-n+1}, \ldots, x_k\}$ and computes n+1 orders of difference $$D(k) = \{\Delta^0(k), \Delta^1(k-1), \ldots, \Delta^n(k-n)\}. \quad (6)$$

For a given processing stage α of an n-stage encoder, where 0≤α≤n.

$$\Delta^\alpha(k-\alpha) = \sum_{i=0}^{\alpha} (-1)^i \binom{\alpha}{i} x_{k-i}. \quad (7)$$

For α=0, $\Delta^0(k)$ represents the original sample $x_k$.

We now define the function F(m,x) that processes an m-bit sample x and returns the least number of bits needed to represent x. For example, if x can be represented as $$x = -2^{m-1}b_{m-1} + \sum_{i=0}^{m-2} 2^i b_i \quad (8)$$

then, computation of F(m,x) may involve the following steps:
1. Obtain the set $\{B_{m-1}, B_{m-2}, \ldots, B_0\}$ where $$B_q = \left(\prod_{i=q}^{m-1} \overline{b_i}\right)\left(\sum_{j=0}^{q-1} b_j\right) \text{ if } b_{m-1} = 0 \quad (9)$$

$$B_q = \left(\prod_{i=q}^{m-1} b_i\right)\left(\sum_{j=0}^{q-1} \overline{b_j}\right) \text{ if } b_{m-1} = 1 \quad (10)$$

where Π and Σ are logical AND and OR operators respectively.
2. Examine the $B_q$ values to determine the value of F(m,x)

$$F(m,x) = 1 \text{ if } B_0 = 1 \quad (11)$$

$$F(m,x) = q+1 \text{ if } B_q\left(\prod_{i=1}^{q-1} \overline{B_i}\right) = 1 \quad (12)$$

Now, if each $x_k$ is represented using m bits, a higher order of difference $\Delta^n(k)$ can be represented using at least 1 bit and at most m+n bits. Therefore, for each element in the set D(k), we use the function F(m,x) to compute the number of bits needed to represent each order of difference as $$G(k) = \{g_k^0, g_k^1, \ldots, g_k^n\} \quad (13)$$

where $$g_k^n = F(m+n, \Delta^n(k-n)) \quad (14)$$

In the set G(k) there exists at least one value a such that $g_k^a \leq g_k^j$ for 0≤j≤n. If there exists more than one value of $g_k^j$ that is the least among the values in G(k), the value corresponding to the least possible j is chosen. When a $g_k^a$ value is chosen, the tuple $\{g_k^a, a, \Delta^a(k-a)\}$ is the desired encoded data.

The encoded data $\{g_k^a, a, \Delta^a(k-a)\}$ generated by the encoder 104 may not be in an optimal format for transmission over the network 108. When the order of difference indicator a and the number of bits $g_k^a$ needed to represent each sample vary often, the savings on the raw data achieved by performing a higher order of difference will be offset by the additional bits needed to represent a and $g_k^a$ for each sample. This issue can be addressed by grouping transformed data in blocks for transmission such that the transformed data for all samples within a given block have the same values for a and $g_k^a$, respectively.

The transmitter 106 performs this grouping function in the present embodiment, by examining the parameters of a block of encoded data of length λ with the objective of determining the least number of bits and order of difference needed to represent the entire block of data.

Since the encoder 104 creates the set G(k) at any step k, this information can be used to determine the number of bits needed to store the transformed data for each order of difference. To accomplish this, at time step k, the transmitter 106 examines the pair of sets G(k) and G(k−1) and creates the quantity H(k) as $$H(k) = \{h_k^0, h_k^1, \ldots, h_k^n\} \quad (15)$$

where $$h_k^n = \max(g_k^n, g_{k-1}^n) \quad (16)$$

When H(k) is computed in this manner for an entire block of length $\lambda$, from time steps k+1 to k+$\lambda$, the set H(k+$\lambda$) will have information on the least number of bits needed to represent each order of difference for the entire block of data. By this rationale, there would exist some $h_{k+\lambda}^{\alpha} \in H(k+\lambda)$ for some $\alpha,j$ ($0 \le \alpha$, $j \le n$) such that $h_{k+\lambda}^{\alpha} \le h_{k+\lambda}^{j}$. In other words, the desired order of difference for the entire block of data is $\alpha$ and each differenced sample in the block can be represented using $h_{k+\lambda}^{\alpha}$ bits since only the $h_{k+\lambda}^{\alpha}$ least significant bits of the differenced sample need to be retained.

Having determined $\alpha$ and $h_{k+\lambda}^{\alpha}$, the block of original data comprising raw samples $\{x_{k+1}, x_{k+2}, \ldots, x_{k+\lambda}\}$ needs to be converted into the block of data $\{\Delta^{\alpha}(k+1-\alpha), \Delta^{\alpha}(k+2-\alpha), \ldots \Delta^{\alpha}(k+\lambda-\alpha),\}$. This may be accomplished by implementing an additional encoder stage in transmitter 106 for order n and extracting data of order $\alpha$ for the entire block of length $\lambda$. In addition, only the least significant $h_{k+\lambda}^{\alpha}$ bits of the data are chosen for transmission, since the more significant bits are obtained by sign extension of the $h_{k+\lambda}^{\alpha}$-th bit position.

Providing an additional encoder stage in the transmitter 106 decreases the complexity of seeking the best possible value of $\alpha$ and $h_{k+\lambda}^{\alpha}$ from $O(n\lambda)$ to $O(n)$. This reduction in computational complexity is significant as the block length $\lambda$ can range anywhere from a few samples to thousands of samples. Moreover, since D(k+1) is evaluated by the encoder 104 at step k+1, this value can be passed on to the transmitter 106 to initialize the differencing component in the transmitter at step k+$\lambda$+1. Knowledge of the state allows the encoder 104 to produce $\Delta^{\alpha}(k+1-\alpha)$ in one additional time step at k+$\lambda$+2 as $\alpha$ and $h_{k+\lambda}^{\alpha}$ is known at the end of k+$\lambda$ steps for the entire block of data of length $\lambda$. Thus the total latency in encoding a block of data of length $\lambda$ is n+$\lambda$+2 steps.

The data emerging from the transmitter 106 may be configured to include a header comprising the tuple $\{\lambda, \alpha, h_{k+\lambda}^{\alpha}\}$ which provides information about the block of data that is to follow. This is followed by the transformed data sequence $\{\Delta^{\alpha}(k+1-\alpha), \Delta^{\alpha}(k+2-\alpha), \ldots \Delta^{\alpha}(k+\lambda-\alpha),\}$. If the number of steps needed to transmit the header is two or more, the two-step latency introduced by the transmitter can be completely masked.

The entire block of data received from the transmitter 106 is processed by the receiver 110 from which it creates the tuple $\{\alpha, \Delta^{\alpha}(k-\alpha)\}$. Since the order of difference is kept constant for the entire block of data, the main function of the receiver 110 is to keep track of the order of difference and number of bits, as each new block is encountered. Much of the work of regenerating the raw samples is performed by the decoder 112.

The decoder 112 in the present embodiment utilizes state variables. More particularly, at any step k, the decoder maintains a set of state variables given by the following set of orders of difference:

$$D(k) = \{\Delta^0(k-1), \Delta^1(k-2), \ldots, \Delta^n(k-n-1)\} \quad (17)$$

It takes the decoder n steps to create the state variables. On every successive time step k (k$\ge$n) the decoder receives an ordered pair $\{\alpha, \Delta^{\alpha}(k-\alpha)\}$ from the receiver 110, where $0 \le \alpha \le n$. If $\alpha=0$, then $\Delta^0(k)$ represents the original sample $x_k$. More generally, for any value of $\alpha$ ($\alpha \ge 0$), the original sample is obtained by $$x_k = \Delta^{\alpha}(k-\alpha) + \sum_{i=0}^{\alpha-1} \Delta^i(k-i-1) \quad (18)$$

Additionally, for $\alpha < j \le n$, the decoder computes $$\Delta^j(k-j) = \Delta^{j-1}(k-j+1) - \Delta^{j-1}(k-j) \quad (19)$$

and uses these values to compute D(k+1). The decoder state variables allow the computation of the original $x_k$ at any step k in the decoding process when $\{\alpha, \Delta^{\alpha}(k-\alpha)\}$ is known.

Figure 4:
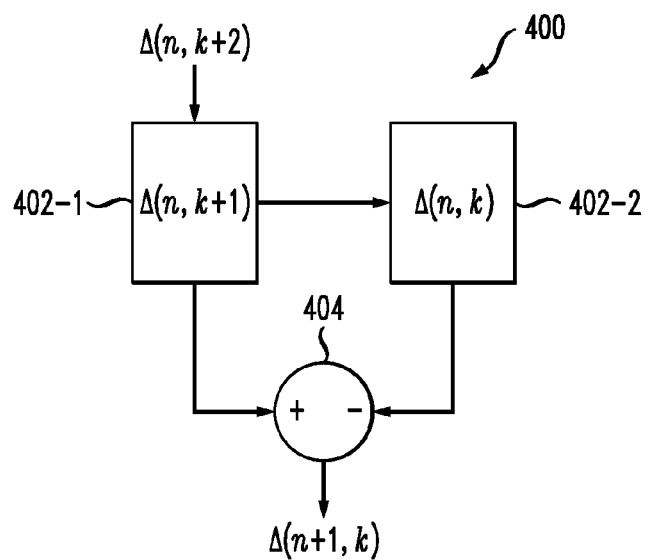
FIG. 4 shows an exemplary processing stage of a difference-based encoder in an illustrative embodiment.

FIG. 4 shows one embodiment of a given processing stage 400 of the encoder 104 configured to operate as described above. In this embodiment, the encoder is assumed to comprise n processing stages, each configured in substantially the same manner as shown in the figure. Each such stage 400 comprises first and second registers 402-1 and 402-2 and an adder 404. At time step k, the register 402-1 in stage $\alpha$ contains the current input $\Delta^{\alpha}(k-\alpha)$ and the register 402-2 contains the previous input $\Delta^{\alpha}(k-\alpha-1)$. The adder 404 in this stage computes the difference between the values $\Delta^{\alpha}(k-\alpha)$ and $\Delta^{\alpha}(k-\alpha-1)$ to generate a higher order of difference $\Delta^{\alpha+1}(k-\alpha-1)$. At the beginning of the next time step k+1, the value $\Delta^{\alpha}(k-\alpha)$ is captured for use in step k+1.

It should be noted that the diagram in FIG. 4 utilizes a slightly different notation than that used in the text above. For example, $\Delta(n, k+1)$ used in FIG. 4 denotes the order of difference $\Delta^n(k+1)$. The remainder of the FIG. 4 notation can be translated to its corresponding text notation in a similar manner. Thus, notation $\Delta(n, k+1)$ and notation $\Delta^n(k+1)$ may be considered interchangeable herein. Similar notational distinctions are also applicable to the diagrams of FIG. 5.

In another possible embodiment of the processing stage 400 of FIG. 4, the register 402-1 may be eliminated, with $\Delta(n, k+1)$ being applied directly to an input of the adder 404 rather than being stored in a register.

The computation complexity for determining $\Delta^n(k)$ is $O(n)$. More specifically, $\Delta^n(k)$ can be computed with n adders and n dual-register storage elements with a latency of n delay cycles and a path delay of n adders. Note that $\Delta^n(k)$ is computed from $\Delta^{n-1}(k+1)$ and $\Delta^{n-1}(k)$, both of which are evaluated at an earlier step in the computation. This results in the set of values D(k) and the corresponding number of bits associated with each element of this set G(k) being readily available at any step k as described earlier.

Figure 5A:
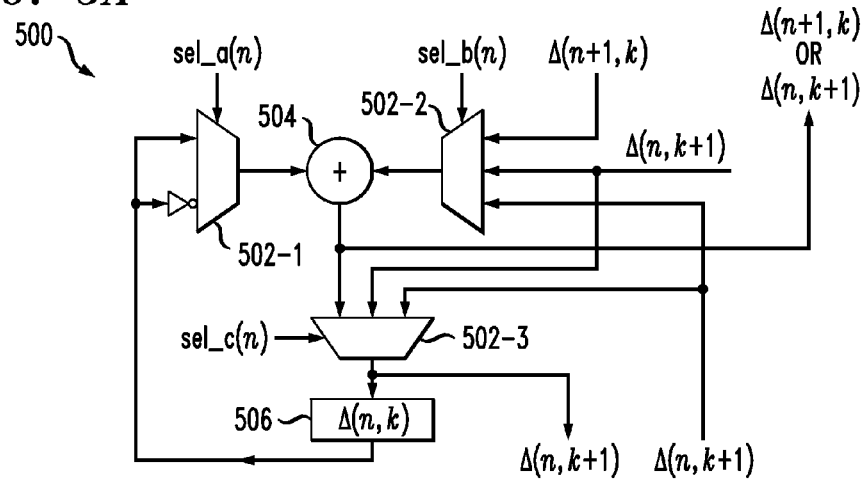
FIGS. 5A, 5B and 5C show exemplary processing stages of a difference-based decoder in respective illustrative embodiments.
Figure 5B:
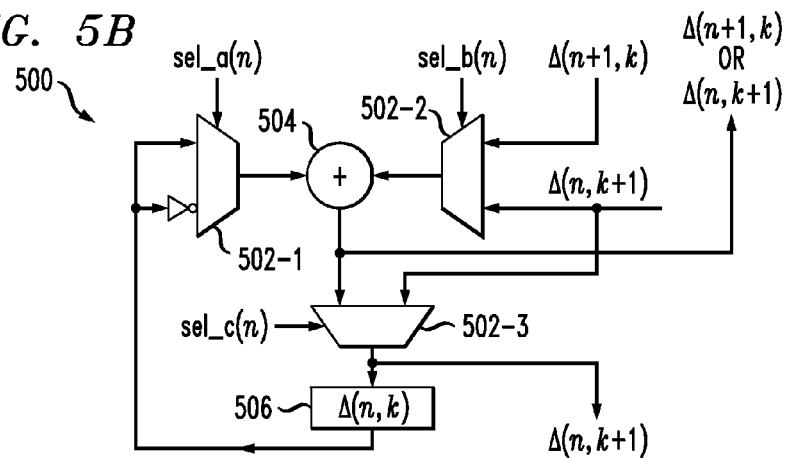
Figure 5C:
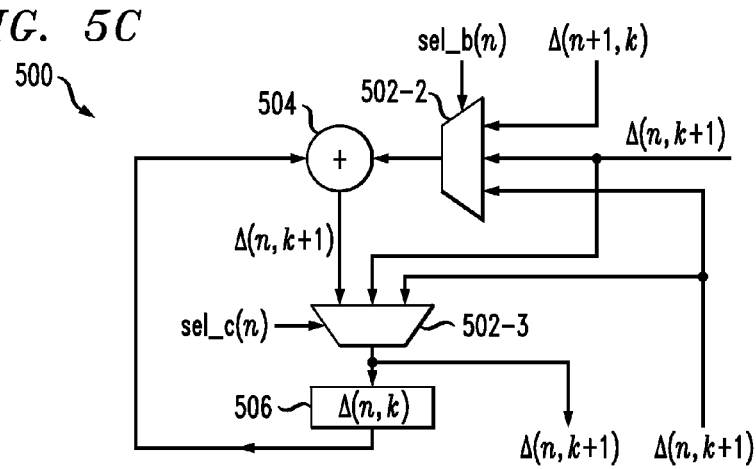

The decoder 112 of order n similarly comprises n processing stages, each configured in substantially the same manner. Examples of such decoder processing stages are shown in FIGS. 5A, 5B and 5C. With reference initially to FIG. 5A, a single one of the n processing stages 500 is shown as comprising three multiplexers 502-1, 502-2 and 502-3, an adder 504 and a register 506.

Assume that for a given stage $\alpha$ ($1 \le \alpha \le n$) of the n stages of the decoder 112 at time step k, the multiplexers 502-1, 502-2 and 502-3 are denoted AMUX1($\alpha$,k), AMUX2($\alpha$,k) and RMUX($\alpha$,k), the adder 504 is denoted ADD($\alpha$,k) and register 506 is denoted REG($\alpha$,k). When the decoder receives the tuple $\{a, \Delta^a(k-a)\}$ at time step k, these elements hold the following values:

$$AMUX1(\alpha,k) = -RMUX(\alpha,k) \text{ when } \alpha \ge a \quad (20)$$

$$AMUX1(\alpha,k) = RMUX(\alpha,k) \text{ when } \alpha < a \quad (21)$$

$$AMUX2(\alpha,k) = RMUX(\alpha+1,k) \text{ when } \alpha < a \quad (22)$$

$$AMUX2(\alpha,k) = \Delta^a(k-a) \text{ when } \alpha = a \quad (23)$$

$$AMUX2(\alpha,k) = ADD(\alpha-1,k) \text{ when } \alpha > a \quad (24)$$

$$RMUX(\alpha,k) = RMUX(\alpha+1,k) \text{ when } \alpha < a \quad (25)$$

$$RMUX(\alpha,k) = \Delta^a(k-a) \text{ when } \alpha = a \quad (26)$$

$$RMUX(\alpha,k)=ADD(\alpha-1,k) \text{ when } \alpha>a \qquad (27)$$

$$ADD(\alpha,k)=AMUX1(\alpha,k)+AMUX2(\alpha,k) \qquad (28)$$

$$REG(\alpha,k)=RMUX(\alpha,k-1) \qquad (29)$$

The original sample $x_k$ emerges at RMUX(0,k) at time step k. The processing stages shown in FIGS. 5B and 5C are examples of other embodiments of processing stages that may be used in a difference-based decoder of the type described herein.

FIGS. 6A through 6E illustrate the operation of an embodiment of the decoder 112, using n instances of the decoder processing stage 500 of FIG. 5A. More particularly, a difference-based decoder 600 in this embodiment comprises four processing stages 500-1, 500-2, 500-3 and 500-4, each configured in the manner shown in FIG. 5A. The decoder 600 further comprises a controller 602 coupled to each of the stages 500 for supplying signals to those stages and for receiving signals from those stages. For example, the controller 602 in this embodiment provides multiplexer select signals to the multiplexers of each of the stages 500, and otherwise controls the operation of the stages 500. In other embodiments, the functionality of the controller may be incorporated in whole or in part into one or more of the processing stages, or into another system element such as a corresponding receiver.

Figure 6A:
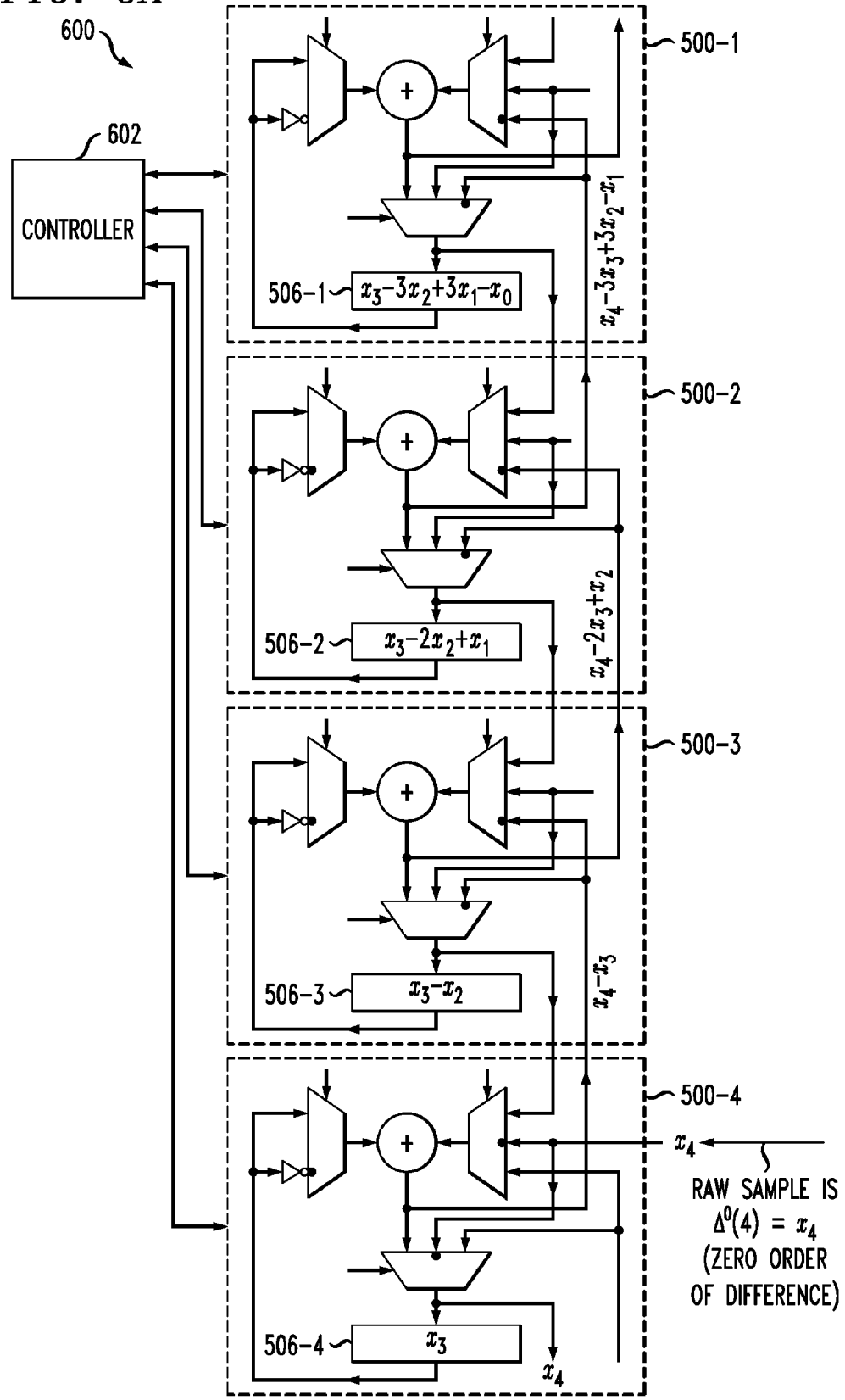
FIGS. 6A through 6E illustrate the operation of a difference-based decoder incorporating multiple processing stages of the type shown in FIG. 5A and an associated controller.

In FIG. 6A, finite differenced data of order zero is presented to the decoder, namely zero order of difference $\Delta^0(4)$. The rectangular boxes corresponding to registers 506-1, 506-2, 506-3 and 506-4 show the state values computed from prior steps. The dots on the multiplexer inputs indicate the mux selection that is appropriate for the corresponding decoding step, in accordance with Equations (20) through (29) above. The absence of a dot indicates that the multiplexer is not used or that its output is a don't care value at the particular step. Thus, for example, in FIGS. 6A through 6D, the output of the upper left multiplexer 502-1 in stage 500-1 is a don't care value, because the output of the adder 504 is not selected by multiplexer 502-3, and in FIG. 6E, where the output of the adder 504 is selected by multiplexer 502-3, the upper left multiplexer 502-1 simply selects the uninverted output of register 506-1. Accordingly, this processing stage 500-1 could be replaced with the simplified processing stage shown in FIG. 5C in which the upper left multiplexer 502 is eliminated.

As another example, the lower multiplexer in stage 500-4 in each of FIGS. 6A through 6E selects one of at most two inputs in each figure, and accordingly may be replaced with the simplified processing stage shown in FIG. 5B in which the lower multiplexer is a two-input multiplexer rather than a three-input multiplexer as in the FIG. 5A processing stage.

In the decoder 600, all higher order differences are automatically computed and stored for processing the next set of data samples. The registers 506-1, 506-2, 506-3 and 506-4 in respective stages 500-1, 500-2, 500-3 and 500-4 store the same values in each of FIGS. 6A through 6E, namely, the values $x_3-3x_2-3x_1-x_0$, $x_3-2x_2+x_1$, $x_3-x_2$, and $x_3$, respectively, as indicated in these diagrams.

Figure 6B:
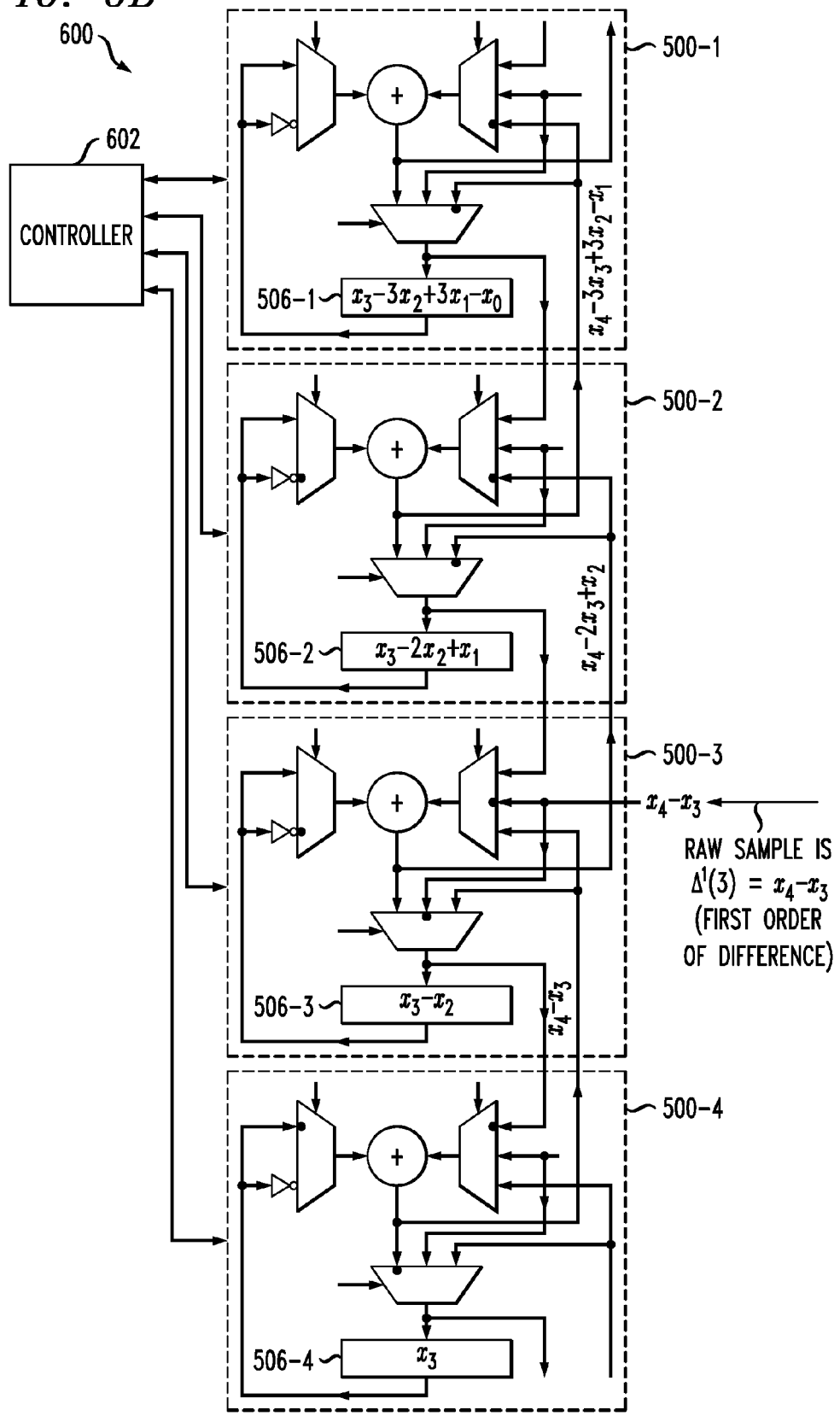

In FIG. 6B, the decoder is presented with a first order differenced data, namely first order of difference $\Delta^1(3)$. The raw sample $x_3$ emerges from the stage below and other higher and lower order differences are updated internally.

Figure 6C:
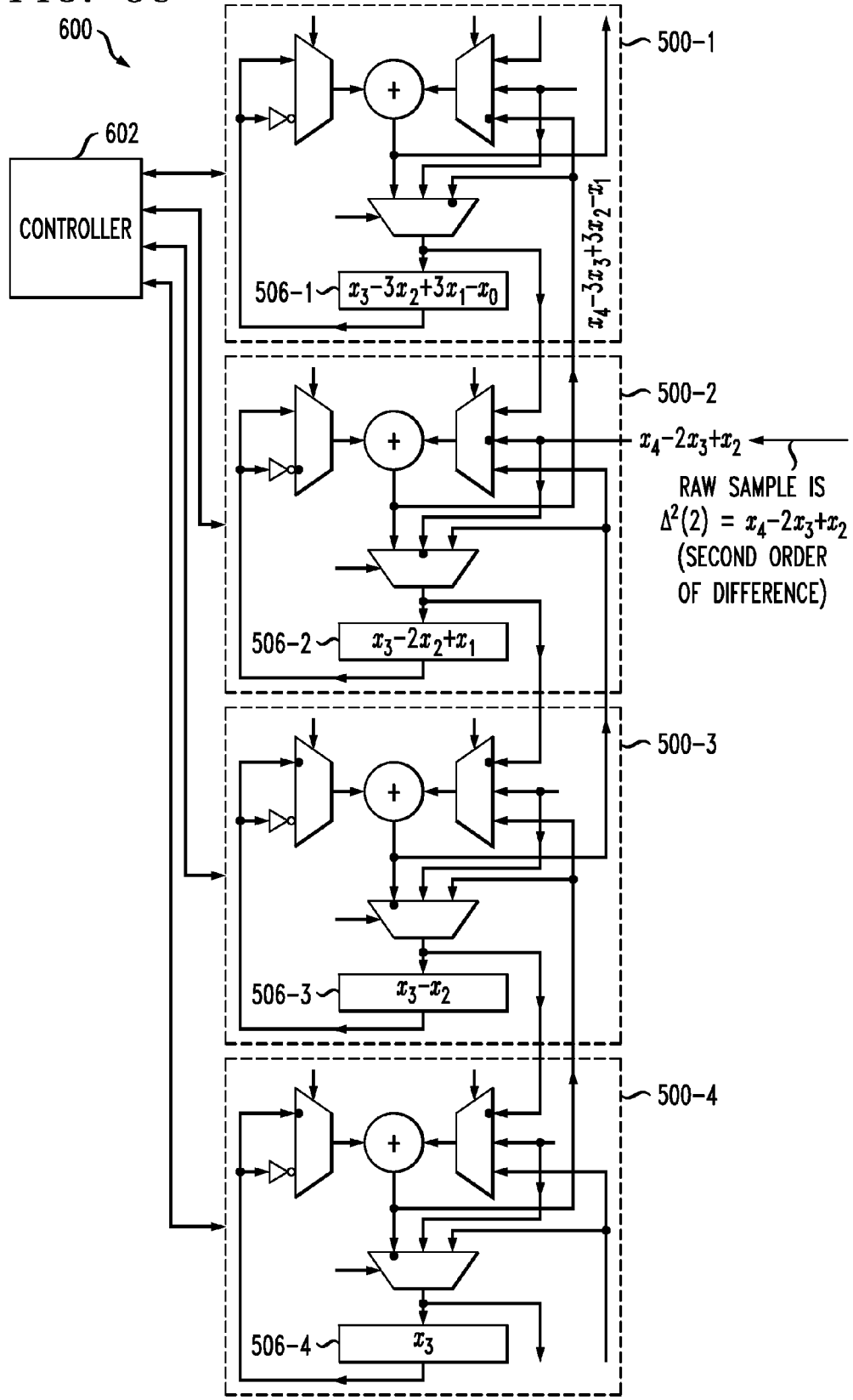

In FIG. 6C, the decoder is presented with a second order differenced data, namely second order of difference $\Delta^2(2)$. The raw sample $x_3$ emerges two stages below and other higher and lower order differences are updated internally.

Figure 6D:
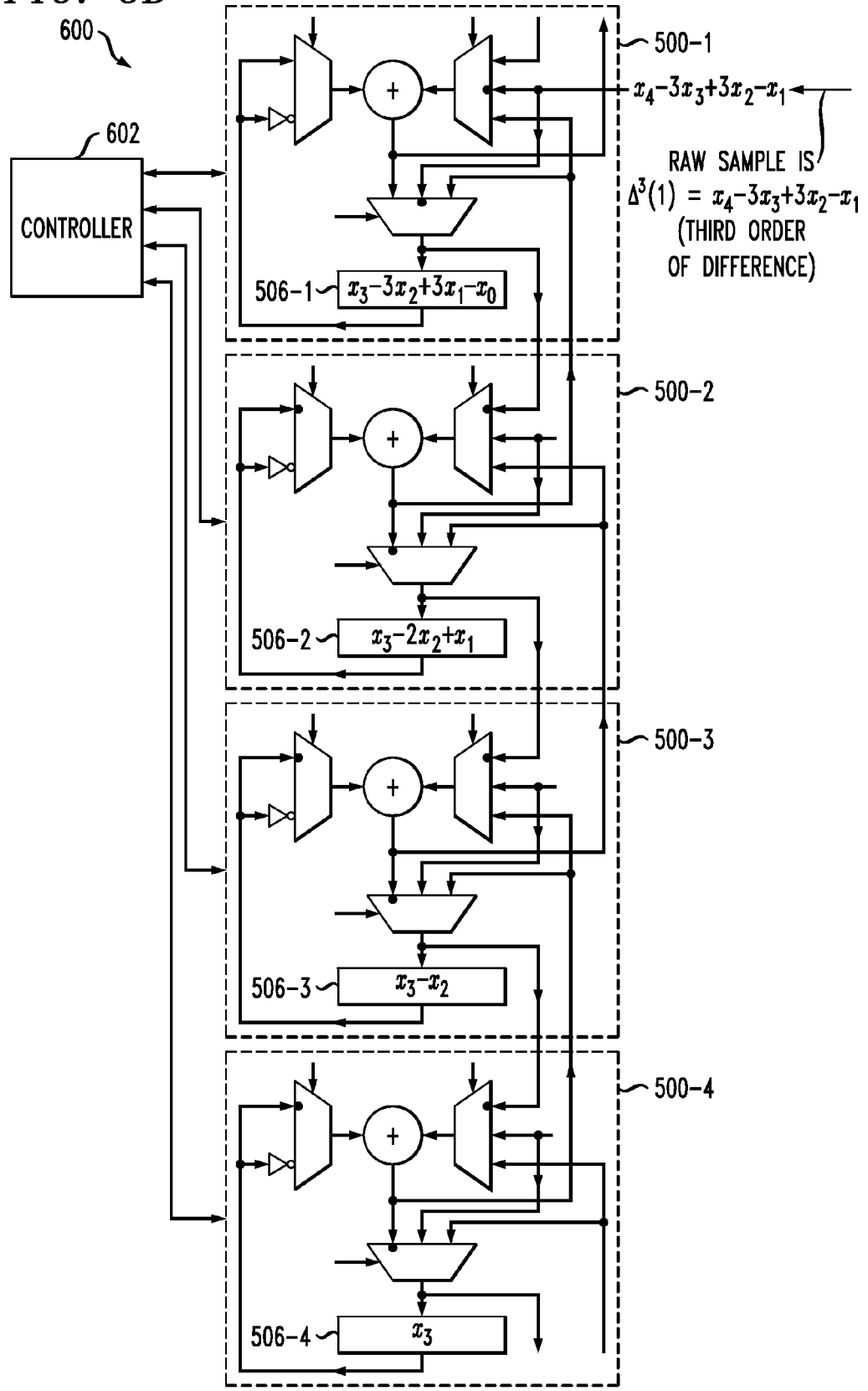

In FIG. 6D, the decoder is presented with a third order differenced data, namely third order of difference $\Delta^3(1)$. The raw sample $x_3$ emerges three stages below and other higher and lower order differences are updated internally.

Figure 6E:
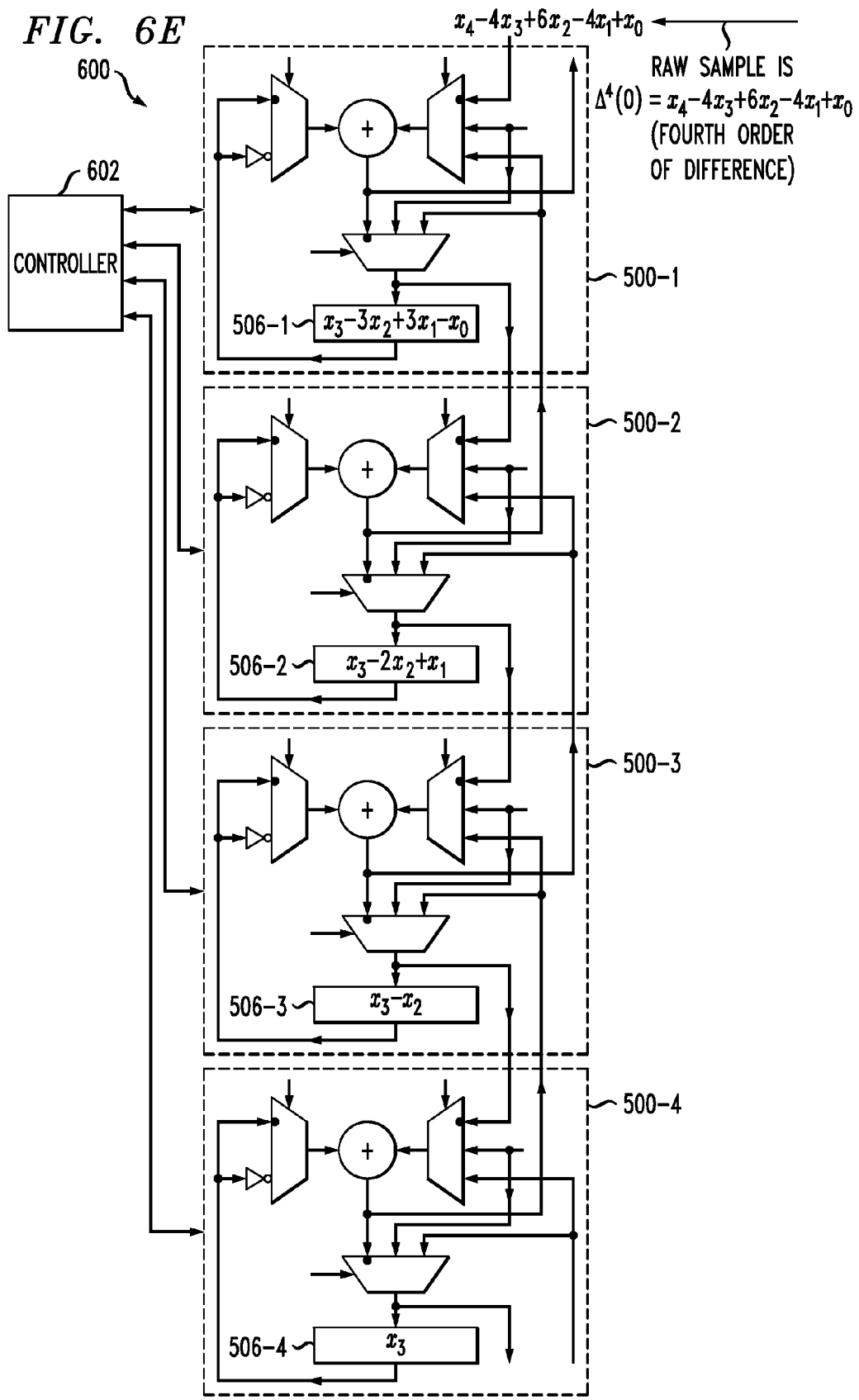

In FIG. 6E, the decoder is presented with a fourth order differenced data, namely fourth order of difference $\Delta^4(0)$. The raw sample $x_3$ emerges four stages below and other higher and lower order differences are updated internally.

These figures illustrate both the simplicity of the decoder architecture and the flexibility in handling varying orders of data differences between successive data samples.

Additional details will now be provided regarding encoding and decoding using difference-based transformation in illustrative embodiments.

It is assumed that up to $\alpha$ orders of difference are computed on the source data sequence as described in Equation (6). The value of $\alpha$ chosen can be either based on heuristics or information about the bandwidth of the underlying signal in relation to sampling frequency. When a heuristics approach is used, $\alpha$ can be derived based on experiments on data representative of that to be processed by the system. When information about the highest frequency component f and the sampling frequency $f_s$ is known, no more than $\alpha$ orders of difference need to be implemented where $\alpha$ is the solution of the equation $$\left[2\sin\left(\frac{\pi f}{f_s}\right)\right]^\alpha = \left(\frac{1}{2}\right)^\gamma \qquad (30)$$

and where $\gamma$ is the reduction in the number of bits needed. In other words, when data compression is possible on the original sequence comprising of m bits, then after higher order differencing, only m−$\gamma$ bits will be necessary. For example, solving this equation for $\gamma=1$ will reduce the size of the original samples by one bit when the necessary conditions for convergence are satisfied.

The encoder functionality in such an embodiment may comprise the following steps:

Step 1: Allow n+1 samples to accumulate in a buffer to compute up to n orders of difference.

Step 2: Compute the desired order of difference as outlined in Equations (6) and (7). An exemplary hardware implementation may comprise cascaded differencing stages of the type illustrated in FIG. 4. Essentially, at any point in time, orders of difference 1 through n are available at the same time. If a software approach is used, successive differences may be computed one after the other, working from the lower order of difference towards the higher order of difference.

Step 3: Compute the metric $B_q$ as outlined in Equations (9) and (10) for each order of difference including zero order (n=0 for no transformation). In addition, we keep track of the least number of bits needed for each order of difference. Given a sequence $\{B_{m-1}, B_{m-2}, \ldots, B_0\}$ we compute a metric B(m) as $$B(m)=B_m \text{ OR } B(m-1) \text{ when } m>0 \qquad (31)$$

$$B(m)=B_m \text{ when } m=0 \qquad (32)$$

where m denotes the index of the sequence and n the order of difference. The value of B(m) computed for the entire length of the data sequence is used to predict the number of bits needed to encode the entire block as outlined in Equations (11) and (12). This approach allows rapid computation of the number of bits needed at any stage. When using software, the bit computation can be done using logical operations instead of arithmetic or bit shift operations, which can speed up computation time.

In situations where space for storing the order of difference is limited, one could instead compute B(m) for the entire block for each order of difference and make note of which order of difference gives the least number of bits. Then the entire sequence of differences can be regenerated for this specific order of difference and passed to the transmitter.

Step 4: Compute the number of bits needed B(m) for each order of difference n until the entire data sequence is processed. Each order of difference n will therefore have a metric B(m) associated with it. This metric is used to compute the number of bits needed to represent the data as outlined in Equations (11) and (12). The order of difference that results in the least number of bits for entire block is chosen as the desired order of difference. Note that when the number of bits needed for order n (n>0) is more than the number of bits used to represent the original sequence (n=0), the original samples are passed as is. We denote the optimal number of bits needed for the sequence as $m_{opt}$.

Practical considerations may require a block of data to be broken down into sub-blocks to ensure that optimal numbers of bits are used for packing each sub-block of data. For example, if a transformed data sequence requires 10 bits for the first 1000 symbols, 15 bits for the next 100 symbols and 10 bits for the next 2000 symbols, it may make sense to split this block into three sub-blocks rather than send the entire block of 3100 symbols using 15 bits.

Step 5: Extract the least significant $m_{opt}$ bits for the chosen order of difference irrespective of whether the differenced data is a positive or a negative quantity. We refer to this data as the payload which is sent to the transmitter.

The transmitter arranges the encoded data for transmission in the manner previously described. In one or more embodiments, the transmitted data may comprise a header, a payload and a footer. The header comprises information that is used by the receiver and decoder to obtain the original sequence. The payload comprises the transformed data sequence obtained from Steps 1 through 5 outlined above. The footer has information about sequence termination, continuation or otherwise.

As a more particular example, the transmitted data in one embodiment may be structured using at least a subset of the fields described below:

Header 1: Indicates the number of raw samples sent as is. This is used to initialize the state variables in the decoder.

Header 2: Indicates the number of bits used to represent raw samples.

Header 3: As many raw samples needed as the order of difference used.

Header 4: Number of samples in the payload.

Header 5: Indicates the number of bits used to represent each transformed data sample in the sequence $m_{opt}$.

Header 6: Indicates the number of bits used to represent transformed samples ($m_{opt}$).

Payload 1: As many transformed samples as created from Step 5 of the encoder.

Footer 1: Indicates whether the current payload has terminated or has been extended.

If the current sequence has not been terminated, then information regarding any changes to the order of difference or number of bits used to encode the data may be included here. This section can also have more complex information that describes the characteristics of the sequence of data that follows the footer. For example, a certain value encoded into Footer 1 might indicate that the data following the footer will comprise a sequence of a particular number of raw samples using a certain number of bits, followed by a particular number of first order differenced samples using another number of bits, followed by a particular number of second order difference samples using yet another number of bits. This example is used for illustration only and the information in Footer 1 can be used to describe a wide range of arrangements of encoded data.

Footer 2: A non-zero value specifies the number of additional samples that are embedded as payload following the footer. The additional samples may either be raw data samples, or differenced samples using Steps 1 through 5 above. This additional sequence is a continuation of the original sequence of data, but the number of bits used to encode the data and the order of differencing may have changed.

Footer 3: Specifies the order of difference for the data that is about to follow.

Footer 4: Specifies the number of bits for the data that is about to follow.

Payload 2: Continuation of the current sequence using either raw data or data compiled using Steps 1 through 5 above.

Footer 1: See Footer 1 above.

It is to be appreciated that the particular fields and processing operations described above and elsewhere herein are considered examples only, and other embodiments can use different types and arrangements of fields and processing operations. The particular fields and processing operations listed above and elsewhere herein should therefore be viewed as optional rather than as requirements of any embodiment of the invention.

Exemplary operations performed by the receiver 110 in an illustrative embodiment may include the following:

Process header information: When a new block of data is received, the receiver passes the raw data samples in the header as state variables that will be used by the decoder.

Processing of Payload: The payload data is sign extended based on the number of bits specified in the header. Once the entire payload is processed by the receiver, the processed payload data comprises m-bit wide data, same as the width of the data created by the encoder. For the block of data that is processed, the order of difference associated with that block of data and the sign extended data is passed on to the decoder.

Processing of footer and additional payload: Any additional data in the footer is processed in the same manner until the entire block of data has been processed. Once this is done, the output of the encoder would comprise sets of sequences where each sequence would include a sub-sequence of encoded data and the corresponding order of difference used to encode the data.

Exemplary operations performed by the decoder 112 in an illustrative embodiment may include the following:

Step 1: Load state variables. For every new block of data that is received, the decoder receives the initial state variables given by the raw samples stored in the header. This information is used to initialize the registers so that computation of Equation (18) is possible.

Step 2: Retrieve original samples of the sequence. Use the header information to determine the raw samples as outlined in Equations (18) and (19). The functional implementation of the decoder circuitry comprising stage 500 is described above using Equations (20) through (29).

Step 3: Data with multiple payloads. For the second payload in the sequence, the only change would be the order of difference. The order of difference information helps to determine which stage of the decoder gets the data that is fed by the receiver after sign extension. Also, information is provided on what the settings should be when they are applied to the multiplexers as outlined in Equations (20) through (29). When the order of difference changes, the data received from the transmitter is fed to the decoder at a different stage but the original sample is extracted from the same point, namely RMUX (0,k) where k is the total number of stages in the decoder. The differences are thus processed until all data for the block has been processed, including one header and a variable number of footers and payloads.

The above-described illustrative embodiments of encoding and decoding processes using difference-based data transformation may be configured to provide lossless, linear data compression in which compressed data can be directly subject to linear signal processing operations. Such arrangements can reduce the complexity of signal processing operations while providing additional benefits in the form of reduced power dissipation, improved signal integrity and better bandwidth utilization. The amount of data compression provided in a given embodiment may be comparable to that of existing lossless data compression techniques, but system performance is considerably improved.

Again, it should be emphasized that the embodiments of the invention as described herein are intended to be illustrative only. For example, other embodiments of the invention can be implemented using a wide variety of other types of systems, circuitry and associated difference-based data transformation algorithms, than those included in the embodiments described herein. These and numerous other alternative embodiments within the scope of the following claims will be readily apparent to those skilled in the art.

What is claimed is:

1. An apparatus comprising:
coding circuitry comprising a difference-based encoder having a plurality of processing stages, the difference-based encoder being configured to generate a plurality of orders of difference from a sequence of data samples and to output encoded data determined based on at least a selected subset of the orders of difference;
wherein said selected subset of the orders of difference comprises one or more but less than all of the plurality of orders of difference generated by the difference-based encoder.

2. The apparatus of claim 1 wherein the coding circuitry implements lossless, linear compression of the sequence of data samples.

3. The apparatus of claim 1 wherein the difference-based encoder is configured to:
process a set of data samples in order to compute a set of orders of difference;
determine for each of the data samples in the set of data samples a least number of bits needed to represent that data sample;
determine for each of the orders of difference in the set of orders of difference a number of bits needed to represent that order of difference, based on the least numbers of bits needed to represent the respective data samples; and
output encoded data identifying a particular one of the orders of difference selected based on the numbers of bits needed to represent the orders of difference.

4. The apparatus of claim 1 wherein the difference-based encoder comprises n processing stages and is configured for each of a plurality of time steps k to process a set of n+1 data samples $\{x_{k-n}, x_{k-n+1}, \ldots, x_k\}$ in order to compute n+1 orders of difference given by a set $D(k)=\{\Delta^0(k), \Delta^1(k-1), \ldots, \Delta^n(k-n)\}$ of orders of difference.

5. The apparatus of claim 4 wherein the difference-based encoder is configured to determine for each of the data samples $\{x_{k-n}, x_{k-+1}, \ldots, x_k\}$ a least number of bits needed to represent that data sample.

6. The apparatus of claim 5 wherein the difference-based encoder implements a function F(m,x) that processes a given m-bit data sample x and returns the least number of bits needed to represent x, wherein x can be represented as $$x = -2^{m-1}b_{m-1} + \sum_{i=0}^{m-2} 2^i b_i.$$

7. The apparatus of claim 6 wherein the function F(m,x) determines a set $\{B_{m-1}, B_{m-2}, \ldots, B_0\}$ where $$B_q = \left(\prod_{i=q}^{m-1} \overline{b_i}\right)\left(\sum_{j=0}^{q-1} b_j\right) \text{ if } b_{m-1} = 0$$

$$B_q = \left(\prod_{i=q}^{m-1} b_i\right)\left(\sum_{j=0}^{q-1} \overline{b_j}\right) \text{ if } b_{m-1} = 1$$

where $\Pi$ and $\Sigma$ are logical AND and OR operators, respectively, and determines the least number of bits needed to represent x as follows:

$$F(m, x) = 1 \text{ if } B_0 = 1$$

$$F(m, x) = q + 1 \text{ if } B_q\left(\prod_{i=1}^{q-1} \overline{B_i}\right) = 1.$$

8. The apparatus of claim 7 wherein the difference-based encoder is configured to determine for each of the n+1 orders of difference in the set $D(k)=\{\Delta^0(k), \Delta^1(k-1), \ldots, \Delta^n(k-n)\}$ a number of bits needed to represent that order of difference.

9. The apparatus of claim 8 wherein the difference-based encoder is configured to determine the number of bits needed to represent each order of difference in the set D(k) by computing $G(k)=\{g_k^0, g_k^1, \ldots, g_k^n\}$ where $g_k^n=F(m+n, \Delta^n(k-n))$, identifying at least one value a in the set G(k) such that $g_k^a \leq g_k^j$ for $0 \leq j \leq n$, and selecting a particular $g_k^a$.

10. The apparatus of claim 9 wherein the difference-based encoder is configured to output a tuple $\{g_k^a, a, \Delta^a(k-a)\}$ as encoded data for the time step k.

11. The apparatus of claim 1 wherein a given one of the processing stages comprises one or more registers and an adder, with the one or more registers being configured to store respective ones of the orders of difference and the adder being configured to utilize contents of the one or more registers to determine another of the orders of difference.

12. The apparatus of claim 1 wherein the coding circuitry further comprises a transmitter configured to arrange the encoded data into blocks with each such block having a payload and at least one of a header and a footer.

13. An integrated circuit comprising the apparatus of claim 1.

14. A method comprising:
generating a plurality of orders of difference from a sequence of data samples; and
outputting encoded data determined based on at least a selected subset of the orders of difference;

wherein said selected subset of the orders of difference comprises one or more but less than all of the plurality of orders of difference determined by said generating.

15. The method of claim 14 wherein the generating step further comprises:
processing a set of data samples in order to compute a set of orders of difference;
determining for each of the data samples in the set of data samples a least number of bits needed to represent that data sample;
determining for each of the orders of difference in the set of orders of difference a number of bits needed to represent that order of difference, based on the least numbers of bits needed to represent the respective data samples; and
selecting a particular one of the orders of difference based on the numbers of bits needed to represent the orders of difference.

16. The method of claim 15 wherein the outputting step further comprises outputting encoded data identifying the particular one of the orders of difference selected based on the numbers of bits needed to represent the orders of difference.

17. A computer program product comprising a non-transitory computer-readable storage medium having computer program code embodied therein, wherein the computer program code when executed by a processor of a processing device causes the processing device to perform the steps of the method of claim 14.

18. An apparatus comprising:
coding circuitry comprising a difference-based decoder having a plurality of processing stages, the difference-based decoder being configured to process encoded data comprising a selected subset of a plurality of orders of difference and to reconstruct a sequence of data samples based on the selected subset of the orders of difference;
wherein said selected subset of the orders of difference comprises one or more but less than all of the plurality of orders of difference.

19. The apparatus of claim 18 wherein the decoder at a given time step k maintains a set of state variables corresponding to respective orders of difference given by a set $D(k)=\{\Delta^0(k-1), \Delta^1(k-2), \ldots, \Delta^n(k-n-1)\}$ of orders of difference.

20. The apparatus of claim 19 wherein the decoder is configured to determine initial values for the state variables over n time steps and on each successive time step k (k≥n) the decoder processes encoded data comprising an ordered pair $\{\alpha, \Delta^\alpha(k-\alpha)\}$, where $0 \le \alpha \le n$, and for any value of $\alpha$ ($\alpha \ge 0$), the decoder reconstructs a data sample as $$x_k = \Delta^\alpha(k-\alpha) + \sum_{i=0}^{\alpha-1} \Delta^i(k-i-1).$$

21. The apparatus of claim 20 wherein the decoder is further configured to compute, for $\alpha < j < n$, the values $\Delta^j(k-j) = \Delta^{j-1}(k-j+1) - \Delta^{j-1}(k-j)$ and to use these values to compute $D(k+1)$ to thereby allow reconstruction of data sample $x_k$ at any time step k when $\{\alpha, \Delta^\alpha(k-\alpha)\}$ is known.

22. A method comprising:
processing encoded data comprising a selected subset of a plurality of orders of difference; and
reconstructing a sequence of data samples based on the selected subset of the orders of difference;
wherein said selected subset of the orders of difference comprises one or more but less than all of the plurality of orders of difference.

23. A computer program product comprising a non-transitory computer-readable storage medium having computer program code embodied therein, wherein the computer program code when executed by a processor of a processing device causes the processing device to perform the steps of the method of claim 22.

24. The apparatus of claim 1, wherein the difference-based encoder is configured to select a selected one of the orders of difference based at least in part on numbers of bits needed to represent the orders of difference.

25. An apparatus comprising:
coding circuitry comprising a difference-based encoder having a plurality of processing stages, the difference-based encoder being configured to generate a plurality of orders of difference from a sequence of data samples and to output encoded data determined based on at least a selected one of the orders of difference, wherein the difference-based encoder comprises n processing stages and is configured for each of a plurality of time steps k to process a set of n+1 data samples $\{x_{k-n}, x_{k-n+1}, \ldots, x_k\}$ in order to compute n+1 orders of difference given by a set $D(k)=\{\Delta^0(k), \Delta^1(k-1), \ldots, \Delta^n(k-n)\}$ of orders of difference.

26. An apparatus comprising:
coding circuitry comprising a difference-based decoder having a plurality of processing stages, the difference-based decoder being configured to process encoded data comprising selected ones of a plurality of orders of difference and to reconstruct a sequence of data samples based on the selected orders of difference, wherein the decoder at a given time step k maintains a set of state variables corresponding to respective orders of difference given by a set $D(k)=\{\Delta^0(k-1), \Delta^1(k-2), \ldots, \Delta^n(k-n-1)\}$ of orders of difference.

* * * * *

UNITED STATES PATENT AND TRADEMARK OFFICE
CERTIFICATE OF CORRECTION

PATENT NO. : 8,711,013 B2
APPLICATION NO. : 13/351798
DATED : April 29, 2014
INVENTOR(S) : Prakash Krishnamoorthy et al.

It is certified that error appears in the above-identified patent and that said Letters Patent is hereby corrected as shown below:

In the specification:

In the detailed description of the invention:

Col. 5, lines 15-16, please delete "$A \sin(2\pi ft + \phi)$" and replace with --$A \sin(2\pi ft + \varphi)$--

Col. 5, line 18, please delete "$A \sin(2\pi fk\delta + \phi), K \geq 0$" and replace with
--$A \sin(2\pi fk\delta + \varphi), K \geq 0$--

Col. 5, line 31, please delete "$\Delta^1(k) = A \sin(2\pi f(k+1)\delta + \phi) - A \sin(2\pi fk\delta + \phi)$" and replace with
--$\Delta^1(k) = A \sin(2\pi f(k+1)\delta + \varphi) - A \sin(2\pi fk\delta + \varphi)$--

In the claims:

Claim 5, col. 16, line 3, please delete "$\{x_{k-n}, x_{k-+1}, \ldots, x_k\}$" and replace with --$\{x_{k-n}, x_{k-n+1}, \ldots, x_k\}$--

Signed and Sealed this
First Day of July, 2014

Michelle K. Lee
*Deputy Director of the United States Patent and Trademark Office*